US011044560B2

(12) United States Patent
Kim

(10) Patent No.: US 11,044,560 B2
(45) Date of Patent: Jun. 22, 2021

(54) DISPLAY APPARATUS

(71) Applicant: LG Display Co., Ltd., Seoul (KR)

(72) Inventor: SeYoung Kim, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 0 days.

(21) Appl. No.: 16/589,560

(22) Filed: Oct. 1, 2019

(65) Prior Publication Data
US 2020/0112791 A1 Apr. 9, 2020

(30) Foreign Application Priority Data

Oct. 5, 2018 (KR) .................. 10-2018-0119030

(51) Int. Cl.
H04R 7/04 (2006.01)
H04R 1/02 (2006.01)
H04R 9/02 (2006.01)
H04R 3/00 (2006.01)
H04R 9/06 (2006.01)

(52) U.S. Cl.
CPC ............. *H04R 7/045* (2013.01); *H04R 1/028* (2013.01); *H04R 3/00* (2013.01); *H04R 9/022* (2013.01); *H04R 9/025* (2013.01); *H04R 9/06* (2013.01); *H04R 2499/15* (2013.01)

(58) Field of Classification Search
CPC . H04R 7/04; H04R 7/045; H04R 7/20; H04R 2440/05; H04R 2499/15
See application file for complete search history.

(56) References Cited

U.S. PATENT DOCUMENTS

| 7,664,278 | B2* | 2/2010 | Watanabe | H04R 7/045 381/152 |
| 8,755,844 | B2* | 6/2014 | Lee | H04R 3/12 455/567 |
| 10,216,231 | B1* | 2/2019 | Landick | B06B 1/045 |
| 10,555,081 | B2* | 2/2020 | Denneulin | H04R 7/045 |
| 2001/0055402 | A1* | 12/2001 | Azima | H04R 1/24 381/152 |
| 2003/0123691 | A1* | 7/2003 | Usuki | H04R 7/04 381/396 |

(Continued)

FOREIGN PATENT DOCUMENTS

CN 1319320 A 10/2001
CN 101779451 A 7/2010

(Continued)

OTHER PUBLICATIONS

Office Action dated Nov. 3, 2020, issued in corresponding Chinese Patent Application No. 201910924439.6.

*Primary Examiner* — Ryan Robinson
(74) *Attorney, Agent, or Firm* — Morgan, Lewis & Bockius LLP

(57) ABSTRACT

A display apparatus includes: a display panel configured to display an image, a support member on a rear surface or a side surface of the display panel, the support member being configured to support the display panel, a sound-generating device in contact with the display panel, the sound-generating device being configured to directly vibrate the display panel to generate sound, and a circuit board between the display panel and the support member, wherein the sound-generating device is on the circuit board.

13 Claims, 9 Drawing Sheets

(56) References Cited

U.S. PATENT DOCUMENTS

| | | | |
|---|---|---|---|
| 2006/0093165 A1* | 5/2006 | Kamimura | H04R 7/045 |
| | | | 381/152 |
| 2009/0034174 A1 | 2/2009 | Ko et al. | |
| 2013/0308798 A1* | 11/2013 | Lee | H04R 9/02 |
| | | | 381/151 |
| 2014/0241558 A1* | 8/2014 | Yliaho | H04R 5/02 |
| | | | 381/333 |
| 2015/0086055 A1* | 3/2015 | Kato | H04R 1/02 |
| | | | 381/334 |
| 2015/0373441 A1* | 12/2015 | Behles | H04R 1/028 |
| | | | 381/333 |
| 2017/0280234 A1* | 9/2017 | Choi | H04R 7/045 |
| 2017/0347186 A1* | 11/2017 | Denneulin | H04R 7/045 |
| 2019/0268681 A1 | 8/2019 | Masuda et al. | |
| 2020/0059544 A1* | 2/2020 | Hwang | H04R 17/00 |
| 2020/0107125 A1* | 4/2020 | Choi | H04R 7/045 |
| 2020/0177996 A1* | 6/2020 | Chen | H04R 1/24 |
| 2020/0252707 A1* | 8/2020 | Won | H01L 51/5246 |
| 2020/0260168 A1* | 8/2020 | Masuda | H04R 1/028 |

FOREIGN PATENT DOCUMENTS

| | | |
|---|---|---|
| CN | 202679630 U | 1/2013 |
| CN | 203930745 U | 11/2014 |
| CN | 106406432 A | 2/2017 |
| CN | 107454519 A | 12/2017 |
| CN | 108124218 A | 6/2018 |
| CN | 108124224 A | 6/2018 |
| WO | 2018/123292 A1 | 7/2018 |
| WO | 2018/147588 A1 | 8/2018 |

* cited by examiner

DISPLAY APPARATUS

CROSS-REFERENCE TO RELATED APPLICATION(S)

This application claims the benefit of and priority to Korean Patent Application No. 10-2018-0119030, filed on Oct. 5, 2018, the entirety of which is hereby incorporated by reference.

BACKGROUND

1. Technical Field

The present disclosure relates to a display apparatus, and more particularly, to a display apparatus capable of generating sound by vibrating a display panel.

2. Discussion of the Related Art

With the advent of the full-fledged information age, display apparatuses, which visually display electrical information signals, have rapidly developed and have been applied to a variety of electronic devices, such as smartphones, tablets, laptop computers, monitors, televisions, and the like. Examples of such a display apparatus include a liquid crystal display apparatus (LCD), a field emission display apparatus (FED), an organic light-emitting display apparatus (OLED), and the like.

A liquid crystal display apparatus is a display apparatus that utilizes properties of liquid crystal. Liquid crystal included in a liquid crystal display apparatus, which is a substance in an intermediate state between a liquid and a solid; has qualities of a liquid, such as fluidity; and has qualities of a solid, such as such as a long range order. Liquid crystal has a thin and long molecular structure, and assumes optical anisotropy having directionality in arrangement and polarization properties in that a direction of molecular alignment is changed according to a magnitude when placed in an electric field. Liquid crystal display apparatuses use the optical anisotropy and polarization properties of liquid crystal.

An arrangement direction of liquid crystal molecules is changed by an electric field applied to two electrodes included in a liquid crystal display apparatus to generate a difference in light transmittance. The difference in transmittance due to the liquid crystal arrangement is reflected in a color combination realized as light supplied from a light source included in the liquid crystal display apparatus passes through a color filter to display an image.

An electroluminescence display apparatus, unlike a liquid crystal display apparatus, is a self-luminous display apparatus that does not require a separate light source, so it can be manufactured to be lighter in weight and thinner than a liquid crystal display apparatus, and is superior in color representation, response speed, viewing angle, and contrast ratio (CR) to a liquid crystal display apparatus. As such, the electroluminescence display apparatus has recently come to prominence.

In the electroluminescence display apparatus, an emissive layer EML, using an organic material, is disposed between two electrodes formed of an anode and a cathode. When holes in the anode are injected into the light-emitting layer and electrons in the cathode are injected into the light-emitting layer, the injected electrons and holes are recombined to form excitons in the light-emitting layer, thus emitting light.

In general, a display apparatus displays an image on a display panel included therein, but a separate speaker is provided to provide sound. The speaker is disposed adjacent to the display panel included in the display apparatus. Because a traveling direction of sound generated through the speaker is a rear side of the display panel or a lower side of the display panel, rather than a front side of the display panel on which an image is displayed, sound does not travel in a direction toward a viewer who views an image in front of the display panel. Thus, the viewer's immersion experience is interrupted. Also, because sound travels to the rear side of the display panel or the lower side of the display panel, sound quality may be degraded due to interference with sound reflected from a wall or a floor. If a separate speaker is provided outside the display apparatus, the speaker occupies a certain space, which may restrict design and layout.

SUMMARY

Accordingly, the present disclosure is directed to a display apparatus that substantially obviates one or more of the issues due to limitations and disadvantages of the related art.

An aspect of the present disclosure is to provide a display apparatus having a structure capable of enhancing a viewer's immersion experience, while improving sound quality, by making sound travel in a direction toward a front side of a display panel when an image is viewed, without installation of a separate speaker.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display apparatus, including: a display panel configured to display an image, a support member on a rear surface or a side surface of the display panel, the support member being configured to support the display panel, a sound-generating device in contact with the display panel, the sound-generating device being configured to directly vibrate the display panel to generate sound, and a circuit board between the display panel and the support member, wherein the sound-generating device is on the circuit board.

In another aspect, there is provided a display apparatus, including: a display panel, a support member in contact with the display panel, and a sound-generating device in contact with the display panel, the sound-generating device being configured to directly vibrate the display panel to generate sound, wherein the sound-generating device includes: a plate, a magnet and a center pole on the plate, and a bobbin disposed around the center pole, wherein the sound-generating device is between the display panel and the support member.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this disclosure, illustrate embodiments of the disclosure and together with the description serve to explain various principles of the disclosure.

Figure 1:
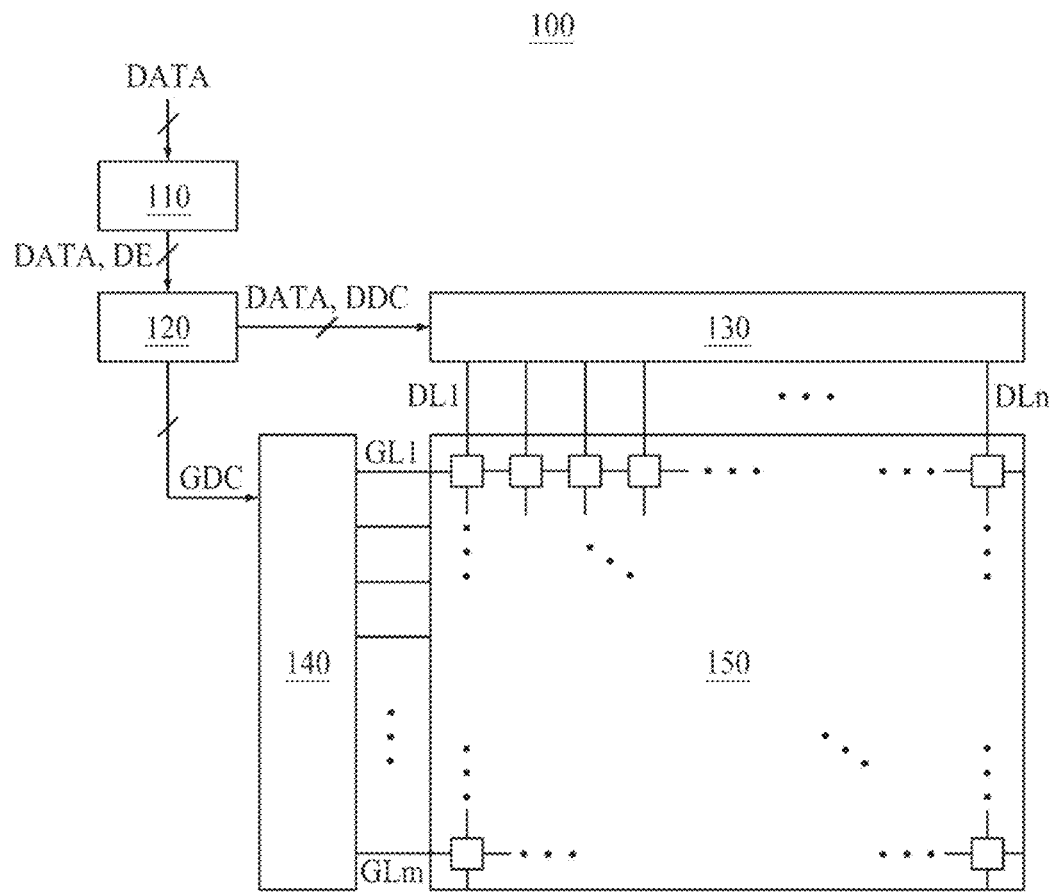
FIG. 1 is a block diagram of a display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. When terms "include," "have," and "include" described in the present disclosure are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case that is not continuous may be included, unless a more limiting term, such as "just," "immediate(ly)," or "direct(ly)," is used.

It will be understood that, although the terms "first," "second," etc. May be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, example embodiments of the present disclosure will be described in detail with reference to the accompanying drawings.

FIG. 1 is a block diagram of a display apparatus according to an embodiment of the present disclosure.

A display panel 150 included in a display apparatus 100 described in FIG. 1 may be an electroluminescence display apparatus, but embodiments are not limited thereto. With reference to the example of FIG. 1, the display apparatus 100 may include an image processing part 110, a timing controller 120, a data driver 130, a gate driver 140, and the display panel 150.

The image processing part 110 may output a data enable signal DE, together with a data signal DATA supplied from the outside. The image processing part 110 may output at least one of a vertical synchronization signal, a horizontal synchronization signal, and a clock signal, in addition to the data enable signal DE.

The timing controller 120 may receive the data signal DATA, from the image processing part 110, together with a driving signal including the data enable signal DE and/or the vertical synchronization signal, a horizontal synchronization signal, and a clock signal. The timing controller 120 may output a gate timing control signal GDC for controlling an operation timing of the gate driver 140, and a data timing control signal DDC for controlling an operation timing of the data driver 130 based on the drive signal.

The data driver 130 may sample and latch the data signal DATA supplied from the timing controller 120 in response to the data timing control signal DDC supplied from the timing controller 120, may convert the latched signal into a gamma reference voltage, and may output the converted voltage. The data driver 130 may output the data signal DATA through the data lines DL1 to DLn.

The gate driver 140 may output a gate signal, while shifting a level of a gate voltage in response to the gate timing control signal GDC supplied from the timing controller 120. The gate driver 140 may output the gate signal through the gate lines GL1 to GLm.

The display panel 150 may display an image as a pixel 160 emits light in response to the data signal DATA supplied from the data driver 130 and the gate signal supplied from the gate driver 140. A detailed structure of the pixel 160 will be described with reference to the examples of FIGS. 2 and 4.

Figure 2:
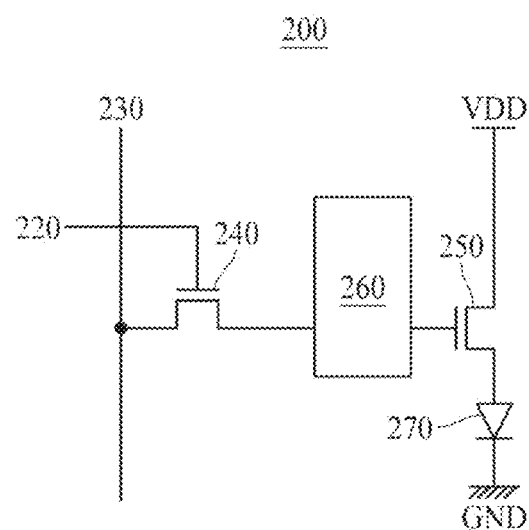
FIG. 2 is a pixel circuit diagram included in a display apparatus according to an embodiment of the present disclosure.

FIG. 2 is a circuit diagram of a pixel included in a display apparatus according to an embodiment of the present disclosure.

The pixel included in a display apparatus 200 described in FIG. 2 may be a pixel included in an electroluminescence display apparatus, but embodiments are not limited thereto. With reference to the example of FIG. 2, a pixel included in the display apparatus 200 may include a switching transistor 240, a driving transistor 250, a compensation circuit 260, and a light-emitting device 270.

The light-emitting device 270 may operate to emit light according to a driving current formed by the driving transistor 250. The switching transistor 240 may perform a switching operation so that a data signal supplied through the data line 230 may be stored as a data voltage in a capacitor in response to the gate signal supplied through the gate line 220. The driving transistor 250 may operate so that a constant driving current may flow between a high potential power supply line VDD and a low potential power supply line GND in response to a data voltage stored in the capacitor. The low potential power supply line GND may receive a ground potential or a low potential voltage.

The compensation circuit 260 may be a circuit for compensating a threshold voltage and the like of the driving transistor 250, and the compensation circuit 260 may include at least one thin-film transistor (TFT) and a capacitor. A configuration of the compensation circuit may vary, depending on a compensation method.

The pixel of the electroluminescence display apparatus 200 may have a two transistor (2T) one capacitor (1C) structure, including a switching transistor 240, a driving transistor 250, a capacitor, and a light-emitting device 270, Alternatively, the pixel of the electroluminescence display apparatus 200 may have various structures, such as 3T1C, 4T2C, 5T2C, 6T1C, 6T2C, 7T1C, 7T2C, and the like when the compensation circuit 260 may be added.

Figure 3:
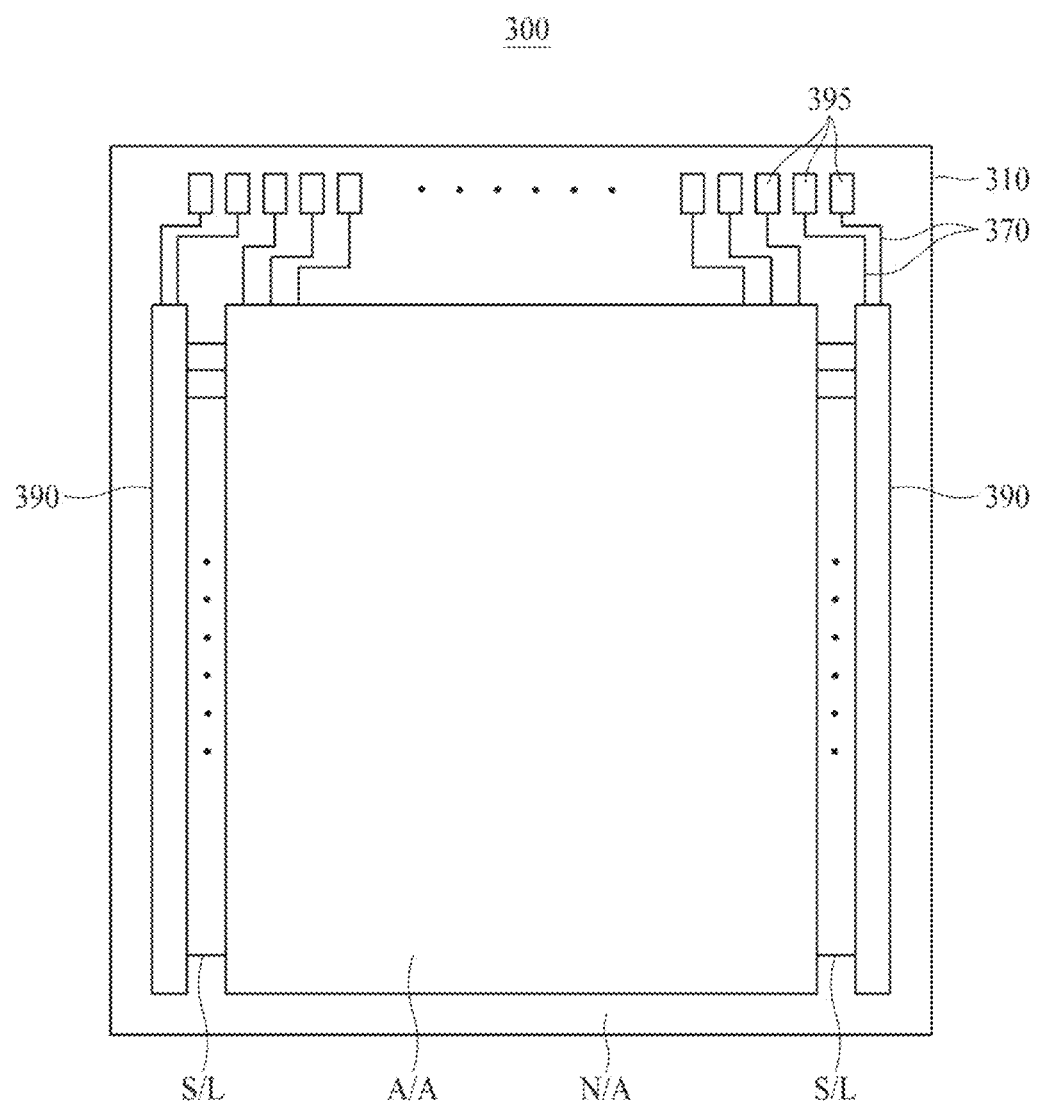
FIG. 3 is a plan view of a display panel included in a display apparatus according to an embodiment of the present disclosure.

FIG. 3 is a plan view of a display panel included in a display apparatus according to an embodiment of the present disclosure.

A display panel 300 included in the display apparatus described with reference to the example of FIG. 3 may be an electroluminescence display apparatus, but embodiments are not limited thereto. With reference to the example of FIG. 3, the display panel 300 may include an active area A/A, in which a pixel that emits light through a TFT and a light-emitting device may be disposed on a substrate 310 and a non-active area N/A surrounding the outer portion of the edge of the active area A/A.

A circuit, such as a gate driver 390 for driving the display panel 300, and various signal lines, such as a scan line S/L, may be formed in the non-active area N/A of the substrate 310. A circuit for driving may be disposed on the substrate 310 in a gate-in-panel (GIP) manner, or may be connected to the substrate 310 in a tape carrier package (TCP) or a chip-on-film (COF) manner.

Pads 395 may be disposed on one side of the substrate 310 in the non-active area N/A. The pads 395 may be a metal pattern to which an external module may be attached.

Various lines may be formed on the substrate 310. A line may also be formed in the active area A/A of the substrate 310. Alternatively, a circuit line 370 formed in the non-active area N/A may transmit a signal by connecting a driving circuit, the gate driver, the data driver, or the like.

The circuit line 370 may include a conductive material, and may include a conductive material having excellent ductility to reduce the occurrence of cracks when the substrate 310 is bent. For example, the circuit line 370 may include a conductive material having excellent ductility, such as gold (Au), silver (Ag), aluminum (Al), or the like, may include various conductive materials used in the active area A/A, and may include, for example, one or more of: molybdenum (Mo), chromium (Cr), titanium (Ti), nickel (Ni), neodymium (Nd), copper (Cu), and alloys of silver (Ag) and magnesium (Mg). The circuit line 370 may include a multilayer structure, including various conductive materials, for example, a three-layer structure of titanium (Ti)/aluminum (Al)/titanium (Ti), but embodiments are not limited thereto.

Figure 4:
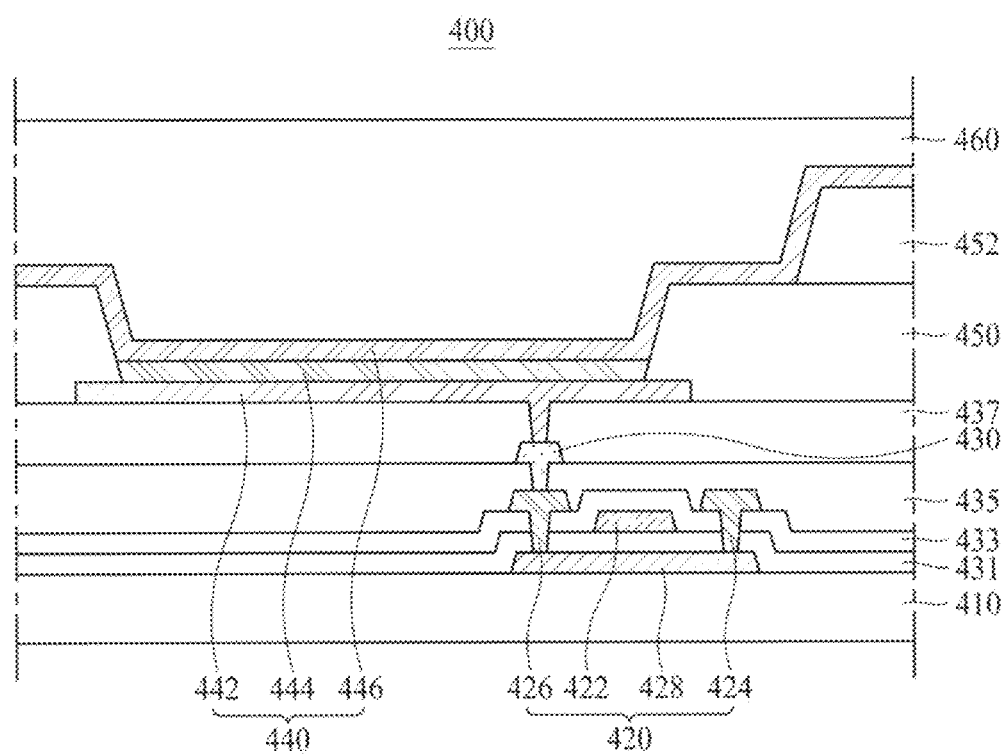
FIG. 4 is a cross-sectional view of a panel display region included in a display apparatus according to an embodiment of the present disclosure.

FIG. 4 is a cross-sectional view of an active area of a display panel included in a display apparatus according to an embodiment of the present disclosure.

A display panel 400 included in the display apparatus illustrated in FIG. 4 may be an electroluminescence display apparatus, but embodiments are not limited thereto. With reference to the example of FIG. 4, a substrate 410 may support and protect the components of the display panel 400 disposed on an upper side thereof. When the substrate 410 includes a ductile material having flexibility, the substrate 410 may be a flexible substrate. For example, the flexible substrate may be provided in the form of a film containing one or more of: a polyester-based polymer, a silicon-based polymer, an acrylic polymer, a polyolefin-based polymer, and a copolymer thereof.

For example, the substrate 410 may include, for example, one or more of: polyethylene terephthalate (PET), polybutylene terephthalate (PBT), polysilane, polysiloxane, polysilazane, polycarbosilane, polyacrylate, polymethacrylate, polymethacrylate, polymethylmetacrylate, polyethylacrylate, polyethylmetacrylate, cyclic olefin copolymer (COC), cyclic olefin polymer (COP), polyethylene (PE), polypropylene (PP), polyimide (PI), polymethylmethacrylate (PMMA), polystyrene (PS), polyacetal (POM), polyether ether ketone (PEEK), polyester sulfone (PES), polytetrafluoroethylene (PTFE), polyvinyl chloride (PVC), polycarbonate (PC), polyvinylidene fluoride (PVDF), perfluoroalkyl polymer (PFA), styrene acrylonitrile polymer (SAN), and combinations thereof.

A buffer layer may be further disposed on the substrate 410. The buffer layer may reduce or prevent penetration of moisture or other impurities through the substrate 410, and may planarize a surface of the substrate 410. The buffer layer may not be an essential component, and may be removed or omitted, depending on the type of the substrate 410 or the type of the TFT 420 disposed on the substrate 410.

The TFT 420 disposed on the substrate 410 may include a gate electrode 422, a source electrode 424, a drain electrode 426, and a semiconductor layer 428. The semiconductor layer 428 may include amorphous silicon or polycrystalline silicon, which has superior mobility to amorphous silicon to have low energy consumption power and excellent reliability, to be applied to a driving TFT in a pixel, but embodiments are not limited thereto.

The semiconductor layer 428 may include an oxide semiconductor. The oxide semiconductor has characteristics of excellent mobility and uniformity. The semiconductor layer 428 may include one or more oxide semiconductors, including, for example, indium tin gallium zinc oxide (InSnGaZnO)-based materials, which are quaternary metal oxides, indium gallium zinc oxide (InGaZnO)-based materials, which are ternary metal oxides, indium tin zinc oxide (InSnZnO)-based materials, indium aluminum zinc oxide-based materials, tin gallium zinc oxide (SnGaZnO)-based materials, aluminum gallium zinc oxide (AlGaZnO)-based materials, tin aluminum zinc oxide (SnAlZnO)-based materials, indium zinc oxide (InZnO)-based materials, which are binary metal oxides, tin zinc oxide (SnZnO)-based materials, aluminum zinc oxide (AlZnO)-based materials, zinc magnesium oxide (ZnMaO)-based materials, tin magnesium oxide (SnMgO)-based materials, indium magnesium oxide (InMgO)-based materials, indium gallium oxide (InGaO)-based materials, indium oxide (InO)-based materials, tin oxide (SnO)-based materials, zinc oxide (ZnO)-based materials, and the like. A composition ratio of each element is not limited.

The semiconductor layer 428 may include a source region, including p-type or n-type impurities, a drain region, and a channel between the source region and the drain region, and a low-concentration doping region between the channel and the adjacent source and drain regions. The source region and the drain region may be regions in which the impurity may be doped at a high concentration, and may be regions to which the source electrode 424 and the drain electrode 426 of the TFT 420 may be respectively connected. As impurity ions, a p-type impurity or an n-type impurity may be used. The p-type impurity may be, for example, one or more of: boron (B), aluminum (Al), gallium (Ga), and indium (In). The n-type impurity may be, for example, one or more of: phosphorus (P), arsenic (As), and antimony (Sb).

The semiconductor layer 428 may be doped with an n-type impurity or a p-type impurity, depending on a structure of an NMOS or PMOS TFT. The TFT included in the electroluminescence display apparatus according to an embodiment of the present disclosure may be an NMOS or a PMOS TFT.

A first insulating layer 431 may be an insulating layer including, for example, a single layer of silicon oxide ($SiO_x$) or silicon nitride ($SiN_x$), or a multilayer thereof, and may be disposed to reduce or prevent a current flowing at the semiconductor layer 428 from flowing to the gate electrode 422. The silicon oxide may be less ductile than the metal, but may be superior in ductility to silicon nitride, and may be formed as a single layer or a plurality of layers, depending on the characteristics.

The gate electrode 422 may serve as a switch for turning on or turning off the TFT 420 based on an electric signal transmitted from the outside through the gate line. The gate electrode 422 may be formed as a single layer or as multiple layers, including, for example, a conductive metal, such as copper (Cu), aluminum (Al), molybdenum (Mo), chrome (Cr), gold (Au), titanium (Ti), nickel (Ni), and neodymium, or an alloy thereof, but embodiments are not limited thereto.

The source electrode 424 and the drain electrode 426 may be connected to the data line, and may transmit an electric signal transmitted from the outside to the light-emitting device 440 from the TFT 420. The source electrode 424 and the drain electrode 426 may be formed as a single layer or multiple layers, including, for example, a conductive metal, such as Cu, Al, Mo, Cr, Au, Ti, Ni, and Nd, or an alloy thereof, but embodiments are not limited thereto. To insulate the gate electrode 422, the source electrode 424, and the drain electrode 426 from each other, a second insulating layer 433 formed as a single layer or as multiple layers of silicon oxide ($SiO_x$) or silicon nitride ($SiN_x$) may be disposed between the gate electrode 422 and the source electrode 424 and the drain electrode 426.

A passivation layer including an inorganic insulating layer, such as silicon oxide ($SiO_x$) or silicon nitride ($SiN_x$) may be further disposed on the TFT 420. The passivation layer may reduce or prevent unnecessary electrical connection between the passivation layer constituents, and may reduce or prevent contamination or damage from the outside. The passivation layer may be omitted, depending on a configuration and characteristics of the TFT 420 and the light-emitting device 440.

The TFT 420 may be classified into an inverted staggered structure and a coplanar structure, depending on the positions of the components of the TFT 420. In the TFT having the inverted staggered structure, the gate electrode may be located on the opposite side of the source electrode and the drain electrode with respect to the semiconductor layer. As illustrated in FIG. 4, in the TFT 420 having the coplanar structure, the gate electrode 422 may be located on the same side of the source electrode 424 and the drain electrode 426 with respect to the semiconductor layer 428. Although the TFT 420 having the coplanar structure is shown in FIG. 4, the TFT having the inverted staggered structure may also be included.

For convenience of explanation, only the driving TFT, among various TFTs, is illustrated. For example, a switching TFT, a capacitor, and the like may also be included. When a signal is applied from the gate line, the switching TFT may transfer a signal from the data line to the gate electrode of the driving TFT. The driving TFT may transmit a current, which may be transmitted through a power supply line, to an anode 442 by a signal received from the switching TFT, and may control light emission by the current transmitted to the anode 442.

Planarization layers 435 and 437 may be disposed on the TFT 420 to protect the TFT 420, to alleviate a step generated due to the TFT 420, and to reduce parasitic capacitance that may occur between the TFT 420 and the gate line (e.g., gate line 220) and between the data line (e.g., data line 230) and the light-emitting devices 440. The planarization layers 435 and 437 may include, for example, one or more of: an acrylic resin, an epoxy resin, a phenolic resin, a polyamide resin, a polyimide resin, an unsaturated polyesters resin, a polyphenylene resin, a polyphenylene sulfides resin, and benzocyclobutene, but embodiments are not limited thereto.

The display panel 400 included in the display apparatus according to an embodiment of the present disclosure may include a first planarization layer 435 and a second planarization layer 437, which may be a plurality of planarization layers 435 and 437 sequentially stacked. For example, the first planarization layer 435 may be stacked on the TFT 420, and the second planarization layer 437 may be sequentially stacked on the first planarization layer 435.

A buffer layer may be disposed on the first planarization layer 435. The buffer layer may be disposed to protect a component disposed on the first planarization layer 435, and may be a single layer of silicon nitride ($SiN_x$) or silicon oxide ($SiO_x$), or may be multiple layers of silicon nitride ($SiN_x$) or silicon oxide ($SiO_x$). The buffer layer may be omitted, depending on a configuration and characteristics of the TFT 420 and the light-emitting device 440.

An intermediate electrode 430 may be connected to the TFT 420 through a contact hole formed in the first planarization layer 435. The intermediate electrode 430 may be stacked to be connected to the TFT 420, and the data line may be formed to have a multilayer structure.

When the data line is formed in a structure in which a lower layer, including the same material as the source electrode 424 and the drain electrode 426, and an upper layer including the same material as the intermediate electrode 430 are connected to each other, the data line may be implemented in a structure in which the two layers may be connected in parallel with each other. Thus, line resistance of the data line may be reduced.

A passivation layer, including an inorganic insulating layer, such as silicon oxide ($SiO_x$) or silicon nitride ($SiN_x$), may be further disposed on the first planarization layer 435 and the intermediate electrode 430. The passivation layer may reduce or prevent unnecessary electrical connection between the components, and may reduce or prevent contamination or damage from the outside. The passivation layer may be omitted, depending on a configuration and characteristics of the TFT 420 and the light-emitting device 440.

The light-emitting device 440 disposed on the second planarization layer 437 may include an anode 442, a light-emitting portion 444, and a cathode 446. The anode 442 may be disposed on the second planarization layer 437. The anode 442 may be an electrode serving to supply holes to the light-emitting portion 444, may be connected to the intermediate electrode 430 through a contact hole in the second planarization layer 437, and may be electrically connected to the TFT 420. The anode 442 may include indium tin oxide (ITO), indium zinc oxide (IZO), or the like, which may be a transparent conductive material, but embodiments are not limited thereto.

When the electroluminescence display apparatus is a top-emission type in which light may be emitted to an upper side where the cathode 446 is disposed, the electroluminescence display apparatus may further include a reflective layer so that emitted light may be more smoothly emitted in the direction of the upper side where the cathode 446 may be disposed. For example, the anode 442 may have a two-layer structure in which a transparent conductive layer, including a transparent conductive material, and a reflective layer may be sequentially stacked, or a three-layer structure in which a transparent conductive layer, a reflective layer, and a transparent conductive layer may be sequentially stacked. For example, the reflective layer may be silver (Ag) or an alloy containing silver.

A bank 450 disposed on the anode 442 and the second planarization layer 437 may define a pixel by demarcating a region that may actually emit light. The bank 450 may be formed by photolithography after photoresist is provided on the anode 442. The photoresist may be a photosensitive resin having a solubility with respect to a developer that may be changed due to an action of light, and a particular pattern may be obtained by exposing and developing the photoresist. The photoresist may be classified into a positive photoresist and a negative photoresist. The positive photoresist may be a photoresist in which solubility of an exposed portion with respect to a developer may be increased by exposure; when the positive photoresist is developed, a pattern in which an exposed portion was removed may be obtained. The negative photoresist may be a photoresist in which solubility of an exposed portion with respect to a developer may be significantly lowered by exposure; when the negative photoresist is developed, a pattern in which a non-exposed portion was removed may be obtained.

A fine metal mask (FMM), which may be a deposition mask, may be used to form the light-emitting portion 444 of the light-emitting device 440. To reduce or prevent damage that may occur in contact with the deposition mask disposed on the bank 450, and to maintain a certain distance between the bank 450 and the deposition mask, a spacer 452, including, for example, one or more of: polyimide, photoacryl, and benzocyclobutene (BCB), which may be transparent organic materials, may be disposed on top of the bank 450.

The light-emitting portion 444 may be disposed between the anode 442 and the cathode 446. The light-emitting portion 444 may emit light, and may include a hole injection layer (HIL), a hole transport layer (HTL), a light-emitting layer, an electron transport layer (ETL), and an electron injection layer (EIL). Some components of the light-emitting portion 444 may be omitted, depending on a structure and characteristics of the electroluminescence display apparatus. For example, an electroluminescent layer and an inorganic light-emitting layer may be applied as the light-emitting layer.

The hole injection layer may be disposed on the anode 442 to facilitate injection of holes. The hole injection layer may include, for example, one or more of: HAT-CN (dipyrazino[2,3-f:2',3'-h]quinoxaline-2,3,6,7,10.11-hexacarbonitrile), CuPc(phthalocyanine), and NPD(N,N'-bis(naphthalene-1-yl)-N,N'-bis(phenyl)-2,2'-dimethylbenzidine).

The hole transport layer may be disposed on the hole injection layer, and may serve to smoothly transfer holes to the light-emitting layer. The hole transport layer may include, for example, one or more of: NPD(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), s-TAD(2,2',7,7'-tetrakis(N,N-dimethylamino)-9,9-spirofluorene), and MTDATA(4,4',4''-Tris(N-3-methylphenyl-N-phenyl-amino)-triphenylamine).

The light-emitting layer may be disposed on the hole transport layer, and may include a material for emitting light of a particular color. The light-emitting material may be formed, for example, using a phosphorescent material or a fluorescent material.

When the light-emitting layer emits red light, a peak wavelength of the emitted light may be in the range of about 600 nm to 650 nm, and the light-emitting layer may include a host material including, for example, one or more of: CBP(4,4'-bis(carbazol-9-yl)biphenyl), and mCP(1,3-bis(carbazol-9-yl)benzene); and may include a phosphorescent material including a dopant including, for example, one or more of: PIQIr(acac)(bis(1-phenylisoquinoline)(acetylacetonate) iridium), PQIr(acac)(bis(1-phenylquinoline)(acetylacetonate) iridium), PQIr(tris(1-phenylquinoline) iridium), and PtOEP(octaethylporphyrin platinum). Alternatively, the light-emitting layer may include a fluorescent material including, for example, one or more of: PBD:Eu(DBM)3 (Phen) and perylene.

Here, the term "peak wavelength (λ)" refers to a maximum wavelength of electroluminescence (EL). A wavelength at which the light-emitting layers configuring the light-emitting portion emit unique light may be referred to as "photoluminescence (PL)," and a thickness of the layers configuring the light-emitting layers or light that may be emitted upon being affected by optical characteristics may be referred to as "emittance." Electroluminescence (EL) refers to light finally emitted by the electroluminescence display apparatus, and may be expressed as a product of PL and emittance.

When the light-emitting layer emits green light, a peak wavelength of the emitted light may be in the range of about 520 nm to 540 nm. The light-emitting layer may include a host material including, for example, one or more of: CBP and mCP, and may include a phosphorescent material including a dopant, such as an iridium (Ir) complex including, for example, Ir(ppy)$_3$(tris(2-phenylpyridine)iridium). Also, the light-emitting layer may include a fluorescent material including Alq$_3$(tris(8-hydroxyquinolino)aluminum).

When the light-emitting layer emits blue light, a peak wavelength of the emitted light may be in the range of about 440 nm to 480 nm. The light-emitting layer may include a host material including, for example, one or more of: CBP or mCP, and may include a phosphorescent material including, for example, FIrPic(bis(3,5-difluoro-2-(2-pyridyl)phenyl-(2-carboxypyridyl)iridium). Also, the light-emitting layer may include a fluorescent material including, for example, one or more of: spiro-DPVBi(4,4'-Bis(2,2-diphenyl-ethen-1-yl)biphenyl), DSA(1-4-di-[4-(N,N-di-phenyl)amino]styryl-benzene)-, a PFO(polyfluorene)-based polymer, and a PPV(polyphenylenevinylene)-based polymer.

An electron transport layer may be disposed on the light-emitting layer to smooth mobility of electrons to the light-emitting layer. The electron transport layer may include, for example, one or more of: Liq(8-hydroxyquinolinato-lithium), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole), spiro-PBD, BCP(2,9-Dimethyl-4,7-diphenyl-1,10-phenanthroline), and BAlq(bis(2-methyl-8-quinolinolate)-4-(phenylphenolato)aluminum).

An electron injection layer may be further disposed on the electron transport layer. The electron injection layer may be an organic layer that may facilitate injection of electrons from the cathode 446, and may be omitted, depending on a structure and characteristics of the electroluminescence display apparatus. The electron injection layer may be a metal inorganic compound such as, for example, one or more of: BaF$_2$, LiF, NaCl, CsF, Li$_2$O, and BaO, and may be an organic compound including, for example, one or more of: HAT-CN(dipyrazino[2,3-f:2',3'-h]quinoxaline-2,3,6,7, 10.11-hexacarbonitrile), CuPc(phthalocyanine), and NPD (N,N'-bis(naphthalene-1-yl)-N,N'-bis(phenyl)-2,2'-dimethylbenzidine).

An electron blocking layer or a hole blocking layer blocking a flow of holes or electrons may be further disposed at a position adjacent to the light-emitting layer for reducing or preventing a phenomenon in which electrons move from the light-emitting layer to penetrate through an adjacent hole transport layer when injected to the light-emitting layer, or holes move from the light-emitting layer to penetrate through an adjacent electron transport layer when injected to the light-emitting layer, thus enhancing luminous efficiency.

The cathode 446 may be disposed on the light-emitting portion 444, and may serve to supply electrons to the light-emitting portion 444. When the cathode 446 is configured to supply electrons, the cathode 446 may include a metal material, such as magnesium (Mg), silver-magnesium (Ag—Mg), or the like, which may be a conductive material having a low work function, but embodiments are not limited thereto. When the electroluminescence display apparatus is a top-emission type, the cathode 446 may include a transparent conductive oxide including, for example, one or more of: indium tin oxide (ITO), indium zinc oxide (IZO), indium tin zinc oxide (ITZO), zinc oxide (ZnO), and tin oxide (TiO).

An encapsulating portion 460 may be disposed on the light-emitting device 440 to reduce or prevent the TFT 420 and the light-emitting device 440 from being oxidized or damaged due to moisture, oxygen, or impurities introduced from the outside. The encapsulating portion 460 may be formed by stacking a plurality of encapsulation layers, a foreign material compensation layer, and a plurality of barrier films.

The encapsulation layer may be disposed on the entire upper surface of the TFT 420 and the light-emitting device 440, and may include, for example, one or more of: silicon nitride ($SiN_x$) and aluminum oxide ($Al_yO_z$), which may be an inorganic material, but embodiments are not limited thereto. An encapsulation layer may be further disposed on the foreign material compensation layer disposed on the encapsulation layer.

The foreign material compensation layer may be disposed on the encapsulation layer and may be an organic material, such as silicon oxy carbon ($SiOC_z$), acrylic, or epoxy resin, but embodiments are not limited thereto. When a defect occurs by cracks due to a foreign matter or a particle that may occur during a manufacturing process, a bent portion or the foreign material may be covered by the foreign material compensation layer to be compensated.

A barrier film may be disposed on the encapsulation layer and the foreign material compensation layer to delay penetration of oxygen and moisture from the outside. The barrier film may be formed as a film having light transmittance and double-sided adhesiveness, and may include an insulating material, such as, for example, one or more of: among olefin, acryl, and silicon; or a barrier film including, for example, one or more of: COP (cycloolefin polymer), COC (cycloolefin copolymer), and PC (polycarbonate) may be further stacked, but embodiments are not limited thereto.

Figure 5A:
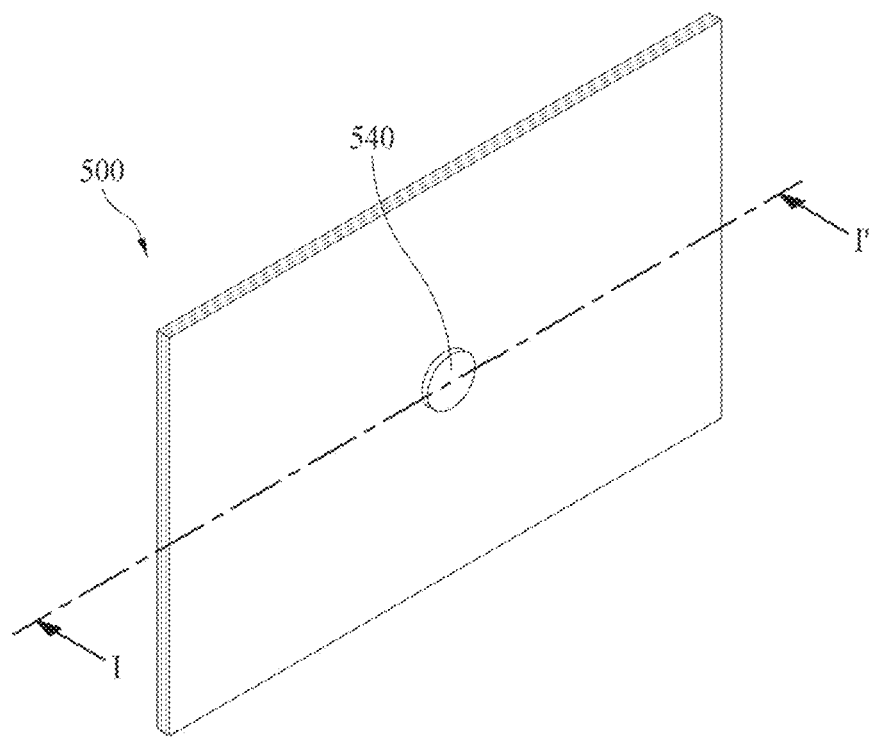
FIG. 5A is a view of a display apparatus including a sound-generating device according to an embodiment of the present disclosure.

FIG. 5A is a view of a display apparatus including a sound-generating device according to an embodiment of the present disclosure.

With reference to the example of FIG. 5A, a display apparatus 500 may include a display panel 510 for displaying an image and a sound-generating device 540 for generating sound by vibrating the display panel. The sound-generating device may be represented by an actuator, an exciter, or a transducer.

Figure 5B:
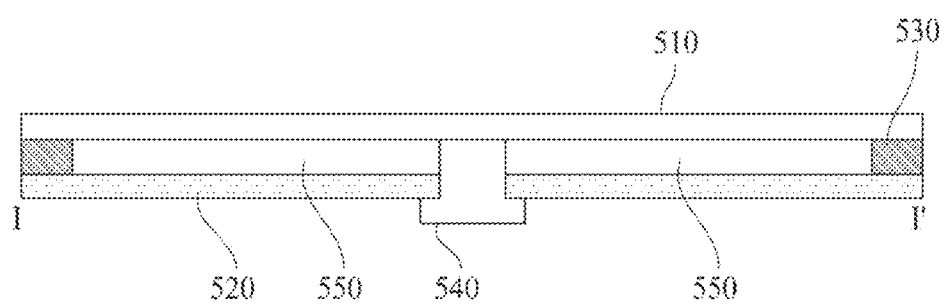
FIG. 5B is a cross-sectional view taken along line I-I' of FIG. 5A.

FIG. 5B is a cross-sectional view taken along line I-I' of FIG. 5A.

With reference to the example of FIG. 5B, the display apparatus 500 may include the sound-generating device 540 and a support member 520. The support member 520 may support at least one of a rear surface or a side surface of the display panel 510. The sound-generating device 540 may be fixed to the support member 520.

The support member 520 may be a cover bottom. The support member 520 may further include a middle cabinet coupled to the cover bottom, while surrounding the side surface of the display panel 510, and receiving one side edge of the display panel 510 to support the display panel 510. For example, the middle cabinet may be configured in the form of a sideways 'T', e.g., '⊢'. The support member 520 may include the cover bottom, or the cover bottom and the middle cabinet. However, without being limited thereto, the support member 520 may further include a structure or the like for supporting the rear surface or the side surface of the display panel 510.

The support member 520 of the present disclosure may be expressed by other names, such as a "cover bottom," a "plate bottom," a "back cover," a "base frame," a "metal frame," a "metal chassis," a "chassis base," an "m-chassis," or the like. The support member 520 may include any type of frame or plate-like structure disposed on the rear surface of the display apparatus as a support for supporting the display panel 510.

The adhesive member 530 may be disposed at the edges of the display panel 510 and the support member 520, and may adhere the display panel 510 to the support member 520. The adhesive member 530 may be a double-sided tape, but embodiments are not limited thereto. The adhesive member 530 may define an air gap 550 between the display panel 510 and the support member 520.

Figure 6A:
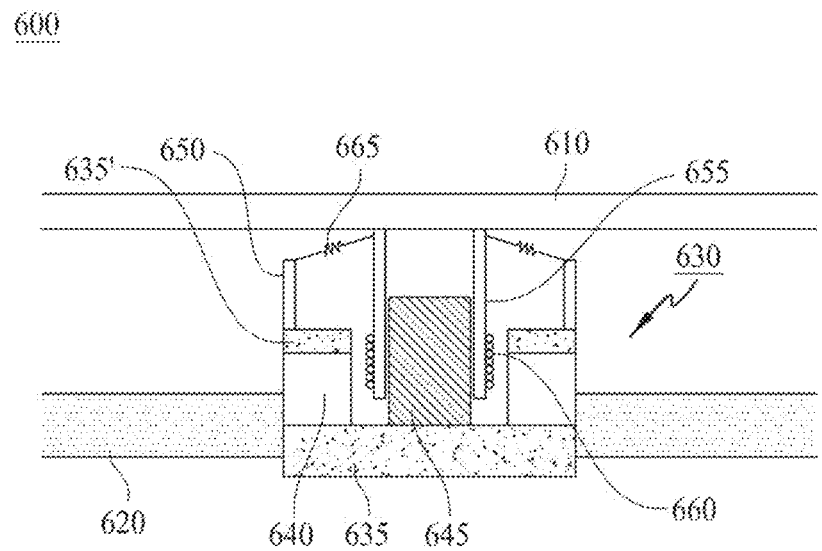
FIGS. 6A and 6B are cross-sectional views of a sound-generating device according to an embodiment of the present disclosure.
Figure 6B:
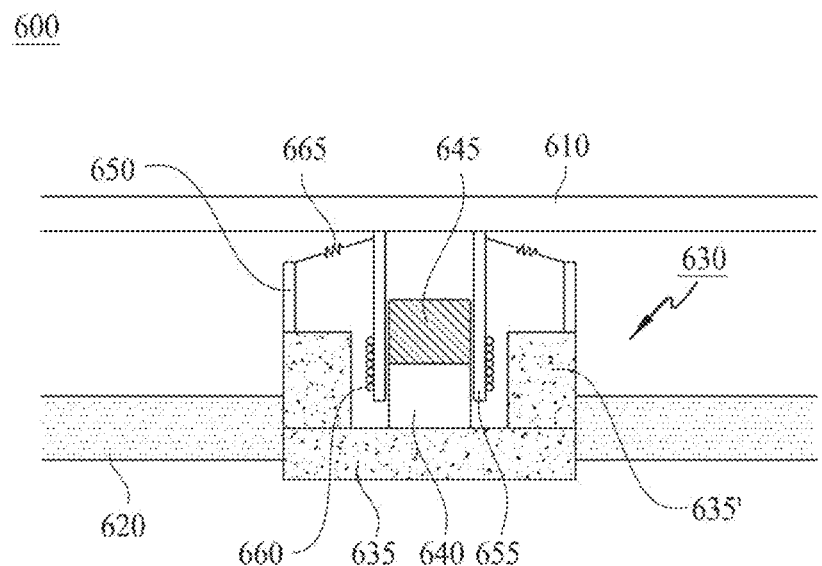

FIGS. 6A and 6B are cross-sectional views of a sound-generating device according to an embodiment of the present disclosure.

A sound-generating device 630, disposed adjacent to a display panel 610 and a support member 620 of a display apparatus 600, may be classified into a first structure in which a magnet is disposed on an outer side of a coil, and a second structure in which a magnet is disposed on an inner side of a coil. The first structure may be referred to as a "dynamic type" and an "external magnetic type," and the second structure may be referred to a "micro type" or an "internal magnetic type." FIG. 6A illustrates an example of the first structure. FIG. 6B illustrates an example of the second structure.

With reference to the example of FIG. 6A, the sound-generating device 630 may include plates 635 and 635', a magnet 640 on the plate, a center pole 645 on the plate, a bobbin 655 disposed around the center pole 645, a coil 660 wound around the bobbin 655, and the like. The magnet 640 may be provided on the first plate 635, and the second plate 635' may be provided on the magnet 640. The first plate 635 and the second plate 635' may fix the sound-generating device 630 to the support member 620, while supporting the magnet 640. Accordingly, the first plate 635 may be fixed to a support hole formed in the support member 300, and the magnet 640 positioned between the first plate 635 and the second plate 635' may be fixed and supported.

At least one of the first plate 635 and the second plate 635' may include a magnetic material, such as iron (Fe). The plate may be not limited to this term, and may be expressed by other terms, such as a "yoke."

The magnet 640 may be a sintered magnet, such as barium ferrite. A material of the magnet 640 may be, for example, one or more of: ferric trioxide ($Fe_2O_3$), barium carbonate ($BaCO_3$), neodymium magnet, strontium ferrite with an improved magnetic component, an alloy casting magnet of aluminum (Al), nickel (Ni), and cobalt (Co), but embodiments are not limited thereto. The neodymium magnet may be, for example, neodymium-iron-boron (Nd—Fe—B).

A frame 650 may be disposed on the second plate 635', and may be outside the first plate 635. A center pole 645 may be disposed at a central region of the first plate 635. The center pole 645 and the first plate 635 may be integrally formed, and the center pole 645 may be referred to as a "pole piece." For example, a pole piece may further be disposed on the center pole 645.

A bobbin 655 may surrounding the center pole 645. A coil 660 may be wound around a lower side of the bobbin 655, and a current for generating sound may be applied to the coil 660.

The coil 660 may be wound around a certain region on the lower side of the bobbin 655. A combination of the bobbin 655 and the coil 660 may be referred to as a "voice coil."

A damper 665 may be disposed between an upper portion of the bobbin 655 and the frame 650. The damper may be referred to by another term, such as an "edge."

FIG. 6B shows the second structure in which a magnet may be disposed inside the coil. With reference to the example of FIG. 6B, a sound-generating device 630' having the second structure may include a magnet 640 on a first plate 635, a center pole 645 on the magnet 640, a bobbin 655 disposed around the center pole 645, and a coil 660 wound around the bobbin 655, and the like.

A frame 650 may be disposed on the second plate 635', and may be outside the first plate 635. A center pole 645 may be disposed at a central region of the first plate 635. The center pole 645 and the first plate 635 may be integrally formed, and the center pole 645 may be referred to as a "pole piece." For example, a pole piece may further be disposed on the center pole 645.

The bobbin 655 may surround the magnet 640 and the center pole 645. A coil 660 may be wound around the bobbin 655. A second plate 635' may be disposed around an outer periphery of the first plate 635. The frame 650 may be disposed outside the second plate 635'. A damper 665 may be disposed between the frame 650 and the bobbin 655.

The sound-generating device having the second structure may be advantageous in that a magnetic flux leakage may be small, and an overall size may be reduced as compared with the first structure in which the magnet may be disposed on the outer side. The sound-generating device for use in the display apparatus according to an embodiment of the present disclosure is not limited to the structures shown in FIGS. 6A and 6B, and any other type of sound-generating devices capable of generating sound by vibrating the display panel may also be used.

Figure 7A:
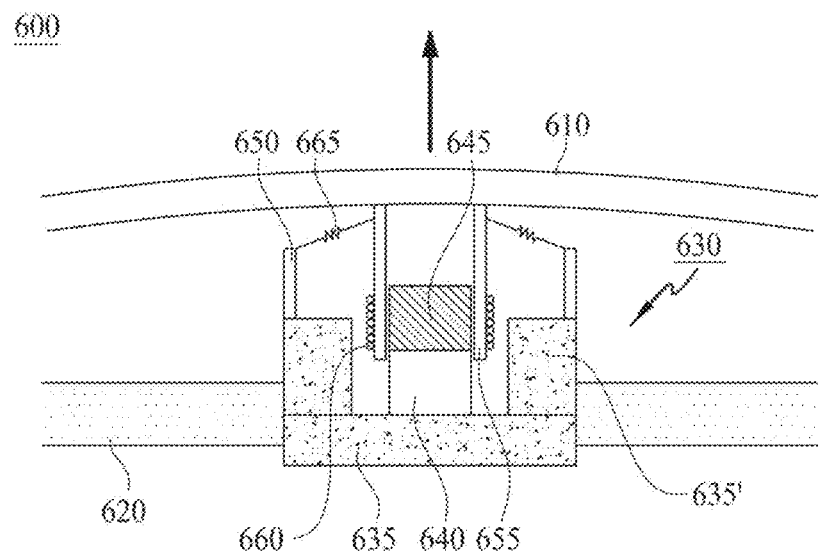
FIGS. 7A and 7B are views illustrating examples of generating sound of a sound-generating device according to an embodiment of the present disclosure.
Figure 7B:
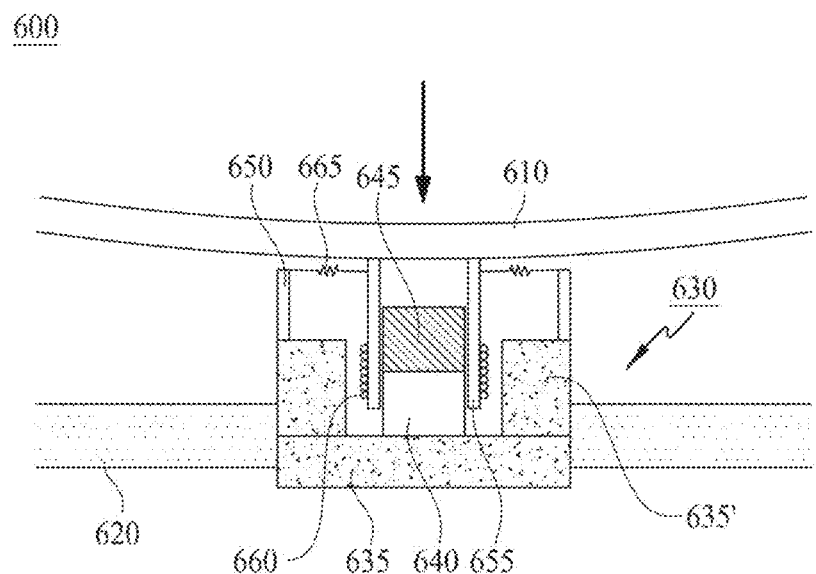

FIGS. 7A and 7B are views illustrating examples of generating sound by a sound-generating device according to an embodiment of the present disclosure.

FIG. 7A shows a state in which a current is applied. The second plate 635' may have a south (S) pole, and the center pole 645 connected to an upper surface of the magnet 640 may have a north (N), and an external magnetic field may be formed between the coils 660. These polarities may not necessarily match each other, and when they are formed opposite to each other, winding directions of the coils 660 may be modified and operated in the same manner. In this state, when a current for generating sound is applied to the coil 660, an applied magnetic field may be generated around the coil 660, and a force for moving the bobbin 655 upward may be generated by the applied magnetic field and an external magnetic field. For example, when a current is applied to the coil 660, a magnetic field may be formed around the coil 660, and when an external magnetic field is formed by the magnet 640, the bobbin 655 may be entirely guided and moved upward by the center pole 645 according to Fleming's Left Hand Rule for Motors.

When the one surface of the bobbin 655 is in contact with a rear surface of the display panel 610, the display panel 610 may be vibrated upward (indicated by the arrow in FIG. 7A) according to application and non-application of a current to the coil 660, and sound waves may be generated by the vibration. In this state, when current application is stopped or a current is applied in the opposite direction, as shown in FIG. 7B, a force for moving the bobbin 655 downward may be generated according to a principle similar to that described above with reference to the example of FIG. 7A, and the display panel 610 may be vibrated downward (indicated by the arrow in FIG. 7B).

The damper 665 may be disposed between the upper portion of the bobbin 655 and the frame 650. The damper 665 may have a corrugated structure, and may contract and expand according to a vertical vibration of the bobbin 655 to adjust the vertical vibration of the bobbin 655.

When the damper 665 is connected to each of the bobbin 655 and the frame 650, the vertical vibration of the bobbin 655 may be adjusted by a restoring force of the damper 665. For example, when the bobbin 655 vibrates above a certain height, or vibrates below the certain height, the bobbin 655 may be restored to its original position by the restoring force of the damper 665. Thus, the display panel 610 may vibrate up and down, depending on a direction in which a current is applied to the coil 660, and a magnitude of the current and sound waves may be generated by the vibration.

Figure 8A:
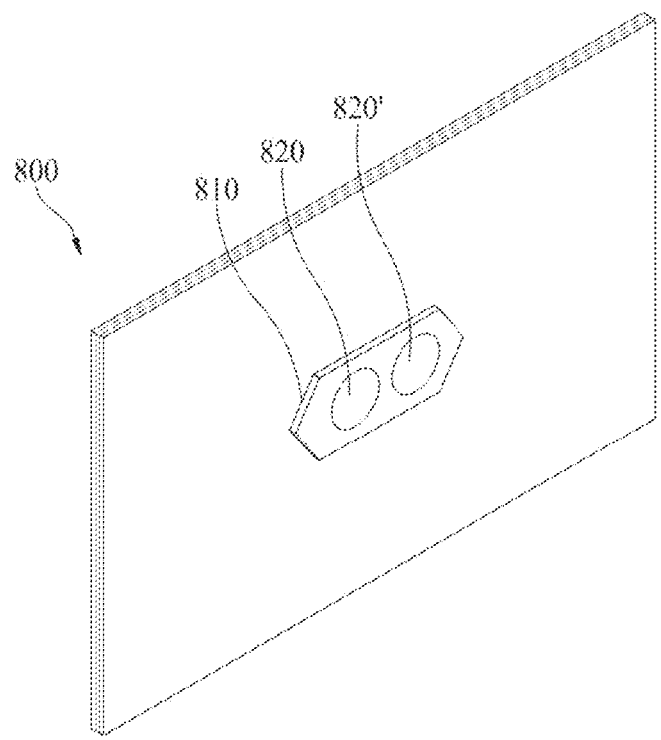
FIG. 8A is a view of a display apparatus including a sound-generating device according to another embodiment of the present disclosure.

FIG. 8A is a view of a display apparatus including a sound-generating device according to another embodiment of the present disclosure.

With reference to the example of FIG. 8A, a display apparatus 800 may include a display panel for displaying an image, and a first sound-generating device 820 and a second sound-generating device 820' for generating sound by vibrating the display panel. The first sound-generating device 820 and the second sound-generating device 820' may be disposed adjacent to each other. When a plurality of sound-generating devices are disposed to be spaced far apart from each other, it may be difficult to uniformly maintain contact characteristics between the sound-generating device and the display panel, and sound quality may be lowered due to interference and delay between the plurality of sound-generating devices.

A fixing device 810 may be provided for fixing the first sound-generating device 820 and the second sound-generating device 820'. The fixing device 810 may be a mold structure that may include a material, such as plastic, by a molding method, but embodiments are not limited thereto. With regard to the structure of the first sound-generating device 820 and the second sound-generating device 820', the first structure or the second structure, described above with reference to the examples of FIGS. 6A and 6B, may be applied.

Figure 8B:
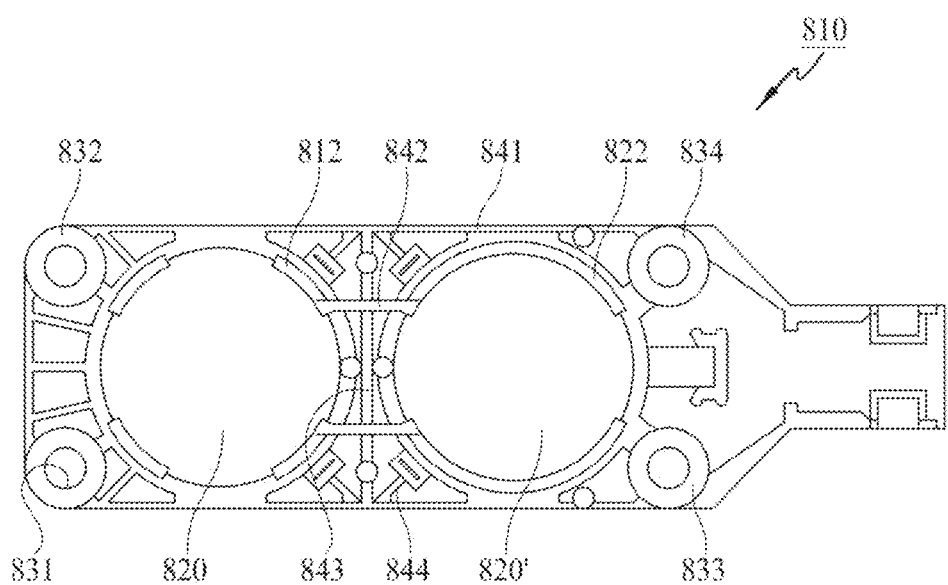
FIG. 8B is a view of a fixing device of a sound-generating device according to another embodiment of the present specification.

FIG. 8B is a view of a fixing device according to another embodiment of a sound-generating device of the present disclosure.

With reference to the example of FIG. 8B, the fixing device 810 of the sound-generating device 810 may be an integral fixing device that may fix and support the first sound-generating device 820 and the second sound-generating device 820' to be adjacent to each other. Accordingly, the first sound-generating device 820 and the second sound-generating device 820', fixed by the fixing device 810, may be referred to as a "pair of sound-generating devices," which will be described as a pair of sound-generating devices hereinafter.

The fixing device 810 of the sound-generating device may include a support portion supporting the sound-generating device, a plurality of rib portions disposed around the sound-generating device, and a plurality of mounting holes for fixing the fixing device to the support member. The support portion may include a first support portion 812 for supporting the first sound-generating device 820, and a second support portion 822 for supporting the second sound-generating device 820'. The first support portion 812 may be a structure for supporting a portion of a side surface and a portion of a rear surface of the first sound-generating device 820, and may have a cylindrical shape. The second support portion 822 may be a structure for supporting a portion of a side surface and a portion of a rear surface of the second sound-generating device 820', and may have a cylindrical shape.

The first support portion 812 and the second support portion 822 may further include two or four arcuate (or curved) protrusion portions. One side of each protrusion portion may be bent to an inner side of each of the sound-generating devices 820 and 820' to support a portion of the rear surface of each of the sound-generating devices 820 and 820'. Thus, the sound-generating devices 820 and 820' may be prevented from being deviated to the outside of the fixing device 810 of the generator, or the deviation may be reduced.

To maintain rigidity of the fixing device 810 of the sound-generating device, and to reduce or prevent the fixing device 810 of the sound-generating device from being deformed, even when it is used for a long time, a plurality of rib portions may be disposed in the periphery of the first support portion 812 and the second support portion 822. The rib portions may include a first rib portion 841 extending from an outer side of the first support portion 812 and the second support portion 822 in a widthwise direction, a second rib portion 842 connecting the first support portion 812 and the second support portion 822 in the widthwise direction, and a third rib portion 843 connected to the first rib portion 841 in a lengthwise direction. For example, the widthwise direction may be a direction of a longer side in which the pair of sound-generating devices may be disposed, and the lengthwise direction may be a direction perpendicular to the widthwise direction.

The first rib portion 841 may extend longitudinally from the outside of the first support portion 812 and the second support portion 822 to form a lateral outer structure of the fixing device 810 of the sound-generating device. A middle region of the first rib portion 841, e.g., a central region between the first support portion 812 and the second support portion 822, may be higher in height than the both side regions of the first rib portion 841, or a thickness of the first rib portion 841 may be thicker. Therefore, even if the pair of sound-generating devices vibrate for a long time, deformation of the fixing device of the sound-generating device may be reduced or prevented, and a change in a relative position between the pair of sound-generating devices and the display panel may be reduced or prevented.

One or more second rib portions 842, integrally connected to the first support portion 812 and the second support portion 822, may be disposed on an inner side of the first rib portion 841. At least one third rib portion 843, integrally connected with the first rib portion 841 and the second rib portion 842, and extending in the widthwise direction, may be formed between the two second rib portions 842 or between the two first rib portions 841.

At least one fourth rib portion 844, extending obliquely, may be further formed between the first support portion 812 or the second support portion 822 and the first rib portion 841. The fourth rib portion 844 may reduce or prevent warpage of the fixing device of the sound-generating device due to heat, e.g., because of use for a long period of time. When the plurality of rib portions are configured near the fixing device for fixing the pair of sound-generating devices and the sound-generating device, rigidity of the sound-generating device may be maintained, and a change in sound characteristics due to a long-time operation may be reduced.

A distance between the first support portion 812 and the second support portion 822 may be greater than a minimum threshold value for forming the rib portion, and may be smaller than a maximum threshold value, which may be a diameter of the first sound-generating device 820 and the second sound-generating device 820'. If the distance between the first support portion 812 and the second support portion 822 is greater than the minimum threshold value, sound quality may be degraded. Therefore, a degradation of sound quality may be reduced by configuring the distance between the first support portion 812 and the second support portion 822 to be smaller than the diameter of the first sound-generating device 820 and the second sound-generating device 820'. For example, when the size (diameter) of the sound-generating device is 'D', and D is, for example, about 7 mm, the distance should be greater than about 7 mm, which may be the minimum threshold value, and smaller than D, which may be the size of the sound-generating device. When the size D of the sound-generating device is about 28 mm, sound quality characteristics may be not significantly changed when the distance is about 0.85*D (about 23.8 mm).

A plurality of mounting holes for fixing the fixing device 810 and the support member may be included. By fastening the screws after aligning mounting holes 831, 832, 833, and 834 of the fixing device 810 with the holes of nuts, the fixing device 810 may be fixed to the support member.

Figure 9A:
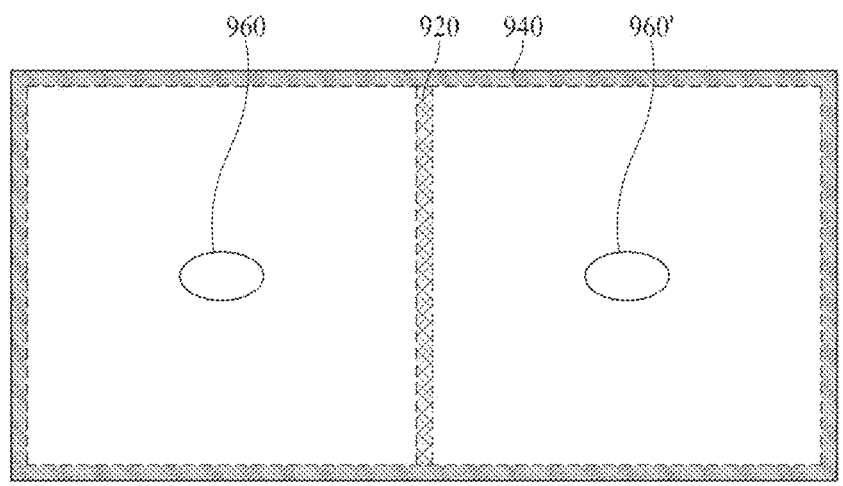
FIGS. 9A and 9B are plan views of a sound-generating device and a partition of a display apparatus according to an embodiment of the present disclosure.
Figure 9B:
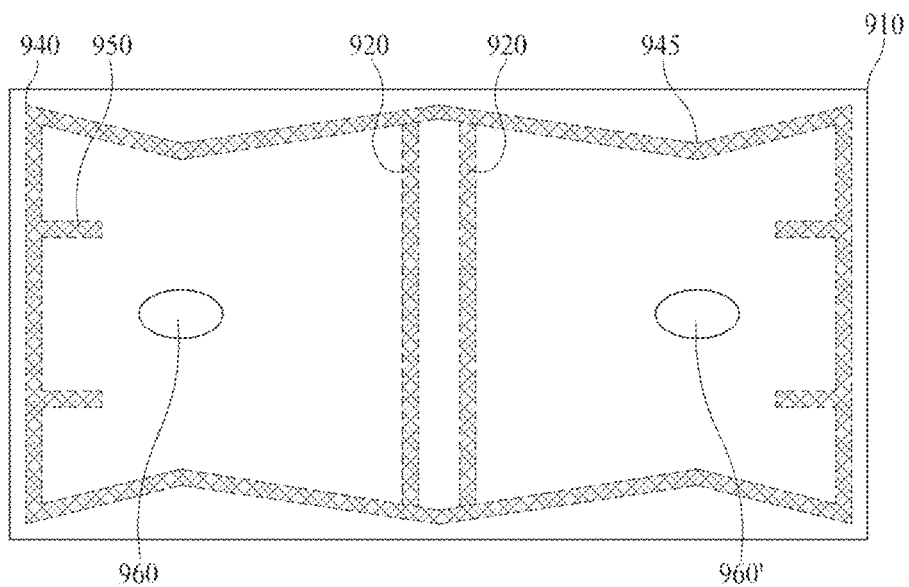

FIGS. 9A and 9B are plan views of a sound-generating device and a partition of a display apparatus according to an embodiment of the present disclosure.

With reference to the example of FIG. 9A, a display apparatus 900 may include a display panel 910, which may include a first region and a second region. The first region may be a left region of the display panel 910, and the second region may be a right region of the display panel. It should be appreciated that the terms "left" and "right" are used herein for convenience of explanation, and are interchangeable, as would be understood by one of ordinary skill in the art. The first sound-generating device 960 may be disposed in the first region of the display panel 100, and the second sound-generating device 960' may be disposed in the second region of the display panel 100.

A first partition 920 may be disposed between the first sound-generating device 960 and the second sound-generating device 960'. A second partition 940 may be disposed to surround outer portions of the first region and the second region in which the first sound-generating device 960 and the second sound-generating device 960' are respectively disposed.

The first partition 920 and the second partition 940 may be an air gap or a space in which sound may be generated when the display panel 910 is vibrated by the sound-generating devices 960 and 960'. The air gap, or space that may generate sound or transmit sound, may be referred to as the "partition." The partition may also be referred to as an "enclosure" or a "baffle," and embodiments are not limited to the term. The first partition 920 and the second partition 940 may be formed to be a sealed structure or may not be sealed.

The first partition 920 may separate left and right sounds generated by the first sound-generating device 960 and the second sound-generating device 960', and may attenuate or absorb vibrations of the display panel 910 at the center, thus reducing or preventing transmission of sound from the left region to the right region or from the right region to the left region. Thus, when the left and right sounds are separated, sound output characteristics may be further improved.

The first sound-generating device 960 and the second sound-generating device 960' may generate sound of a low- to middle-pitched sound range. A low-pitched sound range may be about 200 Hz or less, a middle-pitched sound range may be about 200 Hz to 3 kHz, and a high-pitched sound range may be about 3 kHz or higher, but embodiments are not limited thereto.

The first partition 920 and the second partition 940 may include polyurethane or polyolefin, but embodiments are not limited thereto. The first partition 920 and the second partition 940 may be one or more of: a single-sided tape, a double-sided tape, and the like, and may include a material having elasticity that may be compressed to a certain extent.

FIG. 9B is a plan view of a sound-generating device and partition of a display apparatus according to another embodiment of the present disclosure. With reference to the example of FIG. 9B, the first sound-generating device 960 may be disposed in a first region, which may be a left region of the display panel 910, and a second sound-generating device 960' may be provided in a second region, which may be a right region of the display panel 910.

A first partition 920, which may be at least two partitions, may be disposed between the first sound-generating device 960 and the second sound-generating device 960'. A second partition 940 may be disposed to surround outer portions of the first region and the second region in which first sound-generating device 960 and the second sound-generating device 960' may be respectively disposed.

The first partition 920 may be configured as two or more sub-partitions between the first sound-generating device 960 and the second sound-generating device 960'. The second partition 940 may further include a bent portion 945 or a protrusion portion 950.

A bent portion 945 may be formed in at least one side of the second partition 940. The bent portion 945 may be bent to face the sound-generating devices 960 and 960'. At least one protrusion portion 950 may be configured on a side perpendicular to the side where the bent portion 945 may be formed, and may protrude in a direction toward the first and second sound-generating devices 960 and 960'.

The bent portion 945 and the protrusion portion 950 included in the display apparatus according to an embodiment of the present disclosure may have an effect of reducing or preventing a degradation of sound quality due to various standing waves or reflected waves that may occur as sound waves generated by the sound-generating device 960 may be reflected from the first partition 920 or the second partition 940.

Figure 10:
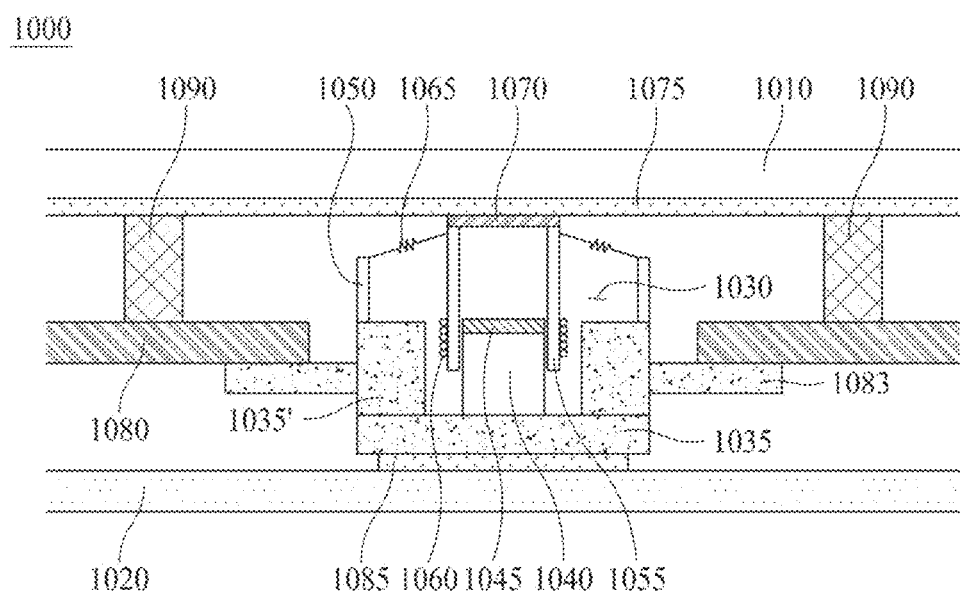
FIG. 10 is a cross-sectional view of a display apparatus including a sound-generating device according to an embodiment of the present disclosure.

FIG. 10 is a cross-sectional view of a display apparatus including a sound-generating device according to an embodiment of the present disclosure.

In an embodiment of the present disclosure, both the sound-generating devices based on the first and second structures described above with reference to the examples of FIGS. 6A and 6B may be applied. The second structure will be described as an example hereinafter.

With reference to the example of FIG. 10, a display apparatus 1000 may include a sound-generating device 1030 having the second structure, which may include a magnet 1040 on a first plate 1035, a center pole 1045 on the magnet 1040, a bobbin 1055 disposed around the magnet 1040 and the center pole 1045, and a coil 1060 wound around the bobbin 1055 and the like. The first plate 1035 may be disposed on a support member 1020. For example, a second heat dissipating member 1085 may be disposed between the first plate 1035 and the support member 1020.

The second heat dissipating member 1085, formed as a heat dissipation sheet or a heat dissipation tape, may include a metal material having high thermal conductivity, such as aluminum (Al), copper (Cu), silver (Ag), and an alloy thereof may serve to spread heat generated by the sound-generating device 1030 to a large region of the support member 1020. For example, the second heat dissipating member 1085 may also serve to adhere and fix the upper first plate 1035 and the lower support member 1020 to each other.

The sound-generating device 1030 may further include an extending portion 1083 protruding from the first plate 1035 to mount the sound-generating device 1030 on the circuit board 1080. The circuit board 1080 may be a printed circuit board (PCB) on which various electronic circuits and components for driving a display panel 1010, including the sound-generating device 1030, may be mounted, and may be electrically connected to an outer portion of the display panel 1010.

As for the display panel 1010 and the circuit board 1080, the circuit board 1080 may be directly adhered and fixed to the rear surface of the display panel 1010, e.g., using a double-sided tape or the like, in a direction facing the electrically connected region. For example, when the sound-generating device 1030 vibrates the display panel 1010 to generate sound, the vibration of the display panel 1010 may be transmitted to the portion where the display panel 1010 may be adhered, which may weaken adhesion, and the circuit board 1080 may not be fixed properly. For example, irregular contact may occur between the circuit board 1080 and the rear surface of the display panel 1010, which may cause abnormal noise.

The display apparatus according to an embodiment of the present disclosure may be configured such that the circuit board 1080 may extend to a region in which the sound-generating device 1030 may be disposed, and the sound-generating device 1030 may be mounted on the circuit board 1080. Thus, the circuit board 1080 may be disposed to be integrated with the sound-generating device 1030.

The sound-generating device 1030 may be mounted in the extended region of the circuit board 1080, and may be fixed to the circuit board 1080, e.g., using a mounting pin or an adhesive tape disposed in the extending portion 1083 of the sound-generating device 1030. When the sound-generating device 1030 is mounted on the circuit board 1080, the circuit board 1080 may be integrally formed with the sound-generating device 1030, so that a region, to which vibration of the display panel 1010 may be transmitted, may be limited to the sound-generating device 1030. When it is not necessary that the circuit board 1080 and the display panel 1010 are in contact with each other, fixing through a double-sided tape or the like may be eliminated or omitted, and abnormal sound caused by irregular contact between the components of the display panel 1010 and the circuit board 1080 may be reduced or prevented.

In addition, the structure may be simplified by mounting a circuit component for driving the sound-generating device 1030 on the circuit board 1080 together, without a separate substrate. Thus, the display apparatus may be simplified by eliminating or omitting a process of disposing the sound-generating device 1030 on an outer side of the support member 1020 using a separate structure, such as a self-clinching nut, e.g., a PEM® nut, or the like, a manufacturing process may be efficient and cost may be reduced.

The magnet 1040 may be disposed on the first plate 1035, and the center pole 1045 may be disposed on the magnet 1040. For example, the center pole 1045 may be referred to as a "pole piece," and a pole piece may be further disposed on the center pole 1045. The bobbin 1055 may be disposed to surround the magnet 1040 and the center pole 1045, and the coil 1060 may be wound around the bobbin 1055.

The second plate 1035' may be disposed around an outer portion of the first plate 1035. A frame 1050 may be disposed outside the second plate 1035'. A damper 1065 may be disposed between the frame 1050 and the bobbin 1055.

A protective member 1070 may be disposed on the bobbin 1055 to protect the bobbin 1055, and may reduce or prevent deformation of the sound-generating device 1030, e.g., due to an external impact. For example, the protective member 1070 may be configured in the form of an injection mold product or a metal mold product, or may include a fiber reinforced material, a composite resin including a fiber reinforced material, or a metal. The fiber reinforced material may include, for example, one or more of: carbon fiber reinforced material (CFRP), glass fiber reinforced plastics (GFRP), and graphite fiber reinforced plastics (GFRP), or a combination thereof. An adhesive member may be disposed between the bobbin 1055, the protective member 1070, and the display panel 1010 to fix the bobbin 1055, the protective member 1070, and the display panel 1010.

In a region in which the circuit board 1080 may be in contact with the display panel 1010, a heat dissipating member may be disposed on one surface of the display panel 1010 to dissipate heat generated in the circuit board 1080. The heat dissipating member may be a heat dissipation sheet, including a metal material having high thermal conductivity, such as aluminum (Al), copper (Cu), silver (Ag), or an alloy thereof.

For example, a first heat dissipating member 1075, which may be a region extending the heat dissipating member of the circuit board 1080 up to the region in which the sound-generating device 1030 may be arranged, may be disposed to spread heat from the sound-generating device 1030 to a larger region. Thus, an image defect due to a rapid difference in temperature in a local region of the display panel 1010 overlapping the sound-generating device 1030 may be reduced or prevented, and the heat dissipating member of the circuit board 1080 may be shared as the first heat dissipating member 1075 extending from the heat dissipating member of the circuit board, thus simplifying the structure of the display apparatus 1000 to make a manufacturing process more efficient and reduce cost. The first heat dissipating member 1075 may be disposed in contact with a protective member 1070 disposed on the bobbin 1055 included in the sound-generating device 1030.

The partition 1090, including the first partition and the second partition described in the examples of FIGS. 9A and 9B, may be mounted on the circuit board 1080. The partition 1090 may include polyurethane or polyolefin, but embodiments are not limited thereto. The partition 1090 may include a one-sided tape, a double-sided tape, or the like. The partition 1090 may include a material having elasticity that can be compressed to a certain degree. The sound-generating device 1030, mounted on the circuit board 1080, may be fixed while the partition 1090 disposed on the upper side thereof may be fixed to the display panel 1010, and the second heat dissipating member 1085 and the support member 1020 disposed on the lower side thereof may be fixed.

A display apparatus according to an embodiment of the present disclosure will be described below.

According to an embodiment of the present disclosure, a display apparatus may include: a display panel configured to display an image, a support member on a rear surface or a side surface of the display panel, the support member being configured to support the display panel, a sound-generating device in contact with the display panel, the sound-generating device being configured to directly vibrate the display panel to generate sound, and a circuit board between the display panel and the support member. The sound-generating device may be on the circuit board.

For example, the display apparatus according to an embodiment of the present disclosure may further include a partition surrounding an outer portion of the sound-generating device on the circuit board. For example, in the display apparatus according to an embodiment of the present disclosure, the sound-generating device may include: a plate, a magnet and a center pole on the plate, and a bobbin disposed around the center pole.

For example, in the display apparatus according to an embodiment of the present disclosure, a protective member may be on the bobbin, and the bobbin and the protective member may be adhered and fixed to each other. For example, in the display apparatus according to an embodiment of the present disclosure, the sound-generating device further may include an extending portion protruding from the plate, and the extending portion and the circuit board may be in contact and fixed to each other.

For example, the display apparatus according to an embodiment of the present disclosure may further include a first heat dissipation member between the circuit board and the display panel, the first heat dissipation member contacting one surface of the display panel. For example, the display apparatus according to an embodiment of the present disclosure may further include a second heat dissipation member between the support member and the sound-generating device.

For example, in the display apparatus according to an embodiment of the present disclosure, the circuit board may be electrically connected to the sound-generating device and the display panel, and the circuit board may be configured to drive the sound-generating device and the display panel. For example, in the display apparatus according to an embodiment of the present disclosure, a first surface of the circuit board may be supported by at least a portion of the extending portion of the sound-generating device, and the partition may be on a second surface of the circuit board opposite to the first surface.

According to an embodiment of the present disclosure, a display apparatus may include: a display panel, a support member in contact with the display panel, and a sound-generating device in contact with the display panel, the sound-generating device being configured to directly vibrate the display panel to generate sound. The sound-generating device may include: a plate, a magnet and a center pole on the plate, and a bobbin disposed around the center pole. The sound-generating device may be between the display panel and the support member.

For example, the display apparatus according to an embodiment of the present disclosure may further include a partition surrounding an outer portion of the sound-generating device on the circuit board. For example, in the display apparatus according to an embodiment of the present disclosure, the sound-generating device may further include an extending portion protruding from the plate, and the extending portion and the circuit board may be in contact and fixed to each other.

For example, the display apparatus according to an embodiment of the present disclosure may further include a first heat dissipation member between the circuit board and the display panel, the first heat dissipation member contacting one surface of the display panel. For example, the display apparatus according to an embodiment of the present disclosure may further include a second heat dissipation member between and directly contacting both of the support member and the sound-generating device. For example, in the display apparatus according to an embodiment of the present disclosure, the circuit board may be electrically connected to the sound-generating device and the display panel, and the circuit board may be configured to drive the sound-generating device and the display panel.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A display apparatus, comprising:
   a display panel configured to display an image;
   a support member on a rear surface or a side surface of the display panel, the support member being configured to support the display panel;
   a sound-generating device in contact with the display panel, the sound-generating device being configured to directly vibrate the display panel to generate sound; and
   a circuit board between the display panel and the support member,
   wherein the sound-generating device is on the circuit board,
   wherein the sound-generating device further comprises an extending portion protruding from the sound-generating device; and
   wherein the extending portion and the circuit board are in contact and fixed to each other.

2. The display apparatus of claim 1, further comprising a partition surrounding an outer portion of the sound-generating device on the circuit board.

3. The display apparatus of claim 2, wherein the sound-generating device comprises:
   a plate;
   a magnet and a center pole on the plate; and
   a bobbin disposed around the center pole.

4. The display apparatus of claim 3, wherein:
   a protective member is on the bobbin; and
   the bobbin and the protective member are adhered and fixed to each other.

5. The display apparatus of claim 1, further comprising a first heat dissipation member between the circuit board and the display panel, the first heat dissipation member contacting one surface of the display panel.

6. The display apparatus of claim 1, further comprising a second heat dissipation member between the support member and the sound-generating device.

7. The display apparatus of claim 1, wherein:
   the circuit board is electrically connected to the sound-generating device and the display panel; and
   the circuit board is configured to drive the sound-generating device and the display panel.

8. The display apparatus of claim 1, wherein:
   a first surface of the circuit board is supported by at least a portion of the extending portion of the sound-generating device; and
   the partition is on a second surface of the circuit board opposite to the first surface.

9. A display apparatus, comprising:
   a display panel;
   a support member in contact with the display panel;
   a sound-generating device in contact with the display panel, the sound-generating device being configured to directly vibrate the display panel to generate sound; and
   a circuit board between the display panel and the support member,
   wherein the sound-generating device comprises:
   a plate,
   a magnet and a center pole on the plate, and
   a bobbin disposed around the center pole,
   wherein the sound-generating device is between the display panel and the support member,
   wherein the sound-generating device further comprises an extending portion protruding from the plate, and
   wherein the extending portion and the circuit board are in contact and fixed to each other.

10. The display apparatus of claim 9, further comprising a partition surrounding an outer portion of the sound-generating device on the circuit board.

11. The display apparatus of claim 9, further comprising a first heat dissipation member between the circuit board and the display panel, the first heat dissipation member contacting one surface of the display panel.

12. The display apparatus of claim 9, further comprising a second heat dissipation member between and directly contacting both of the support member and the sound-generating device.

13. The display apparatus of claim 9, wherein:
   the circuit board is electrically connected to the sound-generating device and the display panel; and
   the circuit board is configured to drive the sound-generating device and the display panel.

* * * * *